US007602327B2

(12) United States Patent
Din et al.

(10) Patent No.: US 7,602,327 B2

(45) Date of Patent: Oct. 13, 2009

(54) DIGITALLY CONTROLLABLE ON-CHIP RESISTORS AND METHODS

(75) Inventors: Imad ud Din, Lund (SE); Filip Oredsson, Lund (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 11/800,954

(22) Filed: May 8, 2007

(65) Prior Publication Data

US 2008/0278277 A1 Nov. 13, 2008

(51) Int. Cl.
*H03M 1/78* (2006.01)

(52) U.S. Cl. ........................ 341/154; 341/118; 341/120; 341/144

(58) Field of Classification Search ................. 341/144, 341/154, 120, 118
See application file for complete search history.

(56) References Cited

U.S. PATENT DOCUMENTS

| | | | | |
|---|---|---|---|---|
| 5,084,703 | A * | 1/1992 | Kane | 341/154 |
| 5,602,925 | A | 2/1997 | Killion | |
| 5,859,606 | A * | 1/1999 | Schrader et al. | 341/144 |
| 5,867,537 | A * | 2/1999 | Dent | 375/298 |
| 5,969,658 | A * | 10/1999 | Naylor | 341/154 |
| 6,201,491 | B1 | 3/2001 | Brunolli et al. | |
| 6,429,798 | B1 * | 8/2002 | Dent | 341/144 |
| 6,552,519 | B1 * | 4/2003 | Nazarian | 323/354 |
| 6,614,374 | B1 * | 9/2003 | Gustavsson et al. | 341/143 |
| 6,633,246 | B1 * | 10/2003 | Bowers | 341/136 |
| 6,693,491 | B1 | 2/2004 | Delano | |
| 6,703,682 | B2 | 3/2004 | Aswell | |
| 6,882,136 | B2 | 4/2005 | Nazarian et al. | |
| 7,095,347 | B2 * | 8/2006 | Hirata et al. | 341/144 |
| 7,129,878 | B1 * | 10/2006 | Shiu et al. | 341/154 |
| 7,164,343 | B2 | 1/2007 | Kessler et al. | |
| 7,233,274 | B1 * | 6/2007 | Kuhn | 341/161 |
| 7,250,890 | B1 * | 7/2007 | Wong | 341/154 |
| 2004/0160350 | A1 | 8/2004 | Lu | |
| 2005/0035890 | A1 | 2/2005 | Karasawa et al. | |
| 2008/0186215 | A1 * | 8/2008 | Brubaker | 341/121 |

FOREIGN PATENT DOCUMENTS

| | | | |
|---|---|---|---|
| DE | 103 47 979 A1 | 5/2005 |
| DE | 10 2006 033705 B3 | 1/2008 |

(Continued)

OTHER PUBLICATIONS

Stanescu, C., et al., "32 Taps Digitally Controlled Buffered Potentiometer," Semiconductor Conference, IEEE, vol. 2, Oct. 2001, pp. 535-538.

(Continued)

*Primary Examiner*—Linh V Nguyen
(74) *Attorney, Agent, or Firm*—Potomac Patent Group PLLC

(57) ABSTRACT

A digitally controllable resistor includes a substrate and at least one digitally controllable resistance stage formed on the substrate. Each of the stage(s) can include a first resistor connected in series with a switch and a second resistor connected in parallel with the first resistor and the switch. Each stage can also include a control line connected to the switch for opening and closing the switch in response to a control bit associated therewith. Multiple resistance stages can be connected in series and the digitally controllable variable resistor can be integrated onto a substrate.

13 Claims, 7 Drawing Sheets

FOREIGN PATENT DOCUMENTS

| | | | |
|---|---|---|---|
| EP | 0 455 839 | A | 11/1991 |
| JP | 01 076507 | A | 3/1989 |
| KR | 2002 0044840 | A | 6/2002 |

OTHER PUBLICATIONS

Sanyal, S., “A Simple Microcontroller Based Building Block for Digital Communication Applications,” TENCON ’98, IEEE, vol. 2, 1998, pp. 324-327.

Vasilopoulos, A., et al., “A Low-Voltage, Highly Linear, Integrated, Active-RC Filter,” Research in Microelectronics and Electronics, IEEE, vol. 1, Jul. 2005, pp. 39-42.

Shi, C., et al., “Design Techniques for Improving Intrinsic Accuracy of Resistor String DAC’s,” Circuits and Systems, IEEE, vol. 1., May 2001, pp. I-400-I-403.

Paker, Y., “A Binary Floating-Point Resistor,” IEEE Transactions on Computers, vol. C-20, No. 1, Jan. 1971, pp. 7-11.

Oredsson, F., et al., “Tunable Multi-Band Channel Select Filter for an LTE Radio Receiver,” Master’s Thesis, Lund University, Dec. 2006, pp. i-xvi, 1-83.

International Search Report of corresponding PCT application No. PCT/EP2008/055569 filed on May 6, 2008.

* cited by examiner

DIGITALLY CONTROLLABLE ON-CHIP RESISTORS AND METHODS

TECHNICAL FIELD

The present invention relates generally to resistors and in particular to methods and devices associated with fabricating digitally controllable on-chip resistors.

BACKGROUND

Resistors play a large part in almost all electronic circuits. In many cases the performance of a circuit is limited by the accuracy of the resistors which are available to implement the circuit. Complementary metal oxide semiconductor (CMOS) chip manufacturing processes are not currently capable of realizing precise resistance values. For example, values of resistors implemented in CMOS chips can vary by as much as 20-30% of their designed values.

Digitally controllable resistors, when implemented in CMOS to counter this probabilistic spread in CMOS resistor yields, rely on transistor switches to change their value according to control signals. However, even in their "on" state, these switches introduce some "on-resistance" in the signal path which may change the behavior of the circuit. Traditional methods try to reduce the effect of this on-resistance by increasing the channel width of the transistors in the switch, hence reducing their on-resistance. However, this also increases the parasitic capacitance of the switch. Thus, CMOS switches either have high parasitic capacitance or significant on-resistance, both of which may affect the performance of the digitally controllable resistors and/or circuit in which they are used.

These issues pose a problem in manufacturing precise resistor values on-chip, whereas the current growth of the telecommunications industry requires the manufacturers to include as much functionality on-chip as possible and avoid using off-chip components. Hence a method to implement precise, linearly variable on-chip resistance values is needed. In addition, temperature changes in electronic circuits during use cause a drift in the values of on-chip resistors. In order to combat this tendency, on-chip variable resistors that can be tuned reliably and accurately within a specified range are also needed.

Several existing approaches attempt to address these problems, some examples of which will now be described. For example, trimming is a post-processing (i.e., post manufacturing) step used to correct the values of on-chip passive components. However this processing adds greatly to the cost of the finished chip. Another approach involves using MOS transistors as variable resistors by biasing and sizing them appropriately. However, this approach is not suitable for applications where, for example, a linear/constant resistance step is needed for every increment in the digital control word because the parallel connection of binary weighted transistors results in non-linear resistance steps in the active resistance range.

A third approach used to address these problems with on-chip resistors involves using pulse width modulation (PWM) on a field effect transistor (FET) in series with a primary resistor. However, this approach has a drawback for communication systems given the possibility of additional noise due to clock feed through. Yet another approach is to use MOS transistors as active fuses to short out tuning resistors placed in series or parallel. However, this approach is not suitable for CMOS applications since implementing low-resistance switches consumes a large area on the chip and introduces considerable parasitic capacitance in the resistor, which may induce non-linear behavior.

Still another approach involves using grounded switched resistor strings. However, this technique causes constant current consumption in the variable resistor due to the ground terminals. This makes this approach unattractive for use in single ended and/or low power circuits. In addition, the number of passive (resistors) and active (switches) components in the circuit increases in an exponential manner as the number of bits in the digital control word increases linearly. Yet another approach uses a CMOS switch or transmission gate arrays as variable resistors. However, this approach uses a binary weighted structure resulting in non-linear resistance steps. Additionally, the transmission gate has non-linear voltage over current characteristics near the extremes of supply voltage range which may lead to a decrease in usable voltage swing.

Accordingly, it would be desirable to provide digitally controllable resistor methods and devices which achieve arbitrarily small, yet substantially linear, incremental resistance steps irrespective of the on-resistance associated with the switches.

SUMMARY

According to an exemplary embodiment, a digitally controllable resistor includes a substrate, at least one digitally controllable resistance stage formed on the substrate, each of the at least one stages including a first resistor connected in series with a switch, a second resistor connected in parallel with the first resistor and the switch, and a control line connected to the switch for opening and closing the switch in response to a control bit associated therewith.

According to another exemplary embodiment, an integrated circuit chip includes a first circuit, disposed on the integrated circuit chip, for performing a function, the first circuit also capable of determining a compensating resistance value associated with performance of the function and generating a digital control word associated with the compensating resistance value; and a digitally controllable, variable resistor connected to the first circuit and including at least one digitally controllable resistance stage, each of the at least one stages including a first resistor connected in series with a switch, a second resistor connected in parallel with the first resistor and the switch, and a control line connected to the first circuit and to the switch for opening and closing the switch in response to a respective bit of the digital control word.

According to another exemplary embodiment, a method for compensating for an effect on an integrated circuit chip includes the steps of estimating a value associated with the effect, generating a digital control word associated with the value, and using at least one bit in the digital control word to operate a respective at least one switch in a digitally controllable, variable resistor, the variable resistor including at least one digitally controllable resistance stage, each of the at least one stages including a first resistor connected in series with one of the at least one switches, and a second resistor connected in parallel with the first resistor and the one of the at least one switches.

The exemplary embodiments described herein provide a number of potential benefits including, for example, the provision of a highly linear and digitally controllable resistor structure having a good frequency response which can be implemented in CMOS technology. The incremental resistance steps associated with the overall resistance of the digitally controllable resistor can be made arbitrarily small, irrespective of the on-resistance of the switch(es). Switches having a minimum channel width can be used in these exemplary architectures to reduce the parasitic capacitance in the resistor. This can provide a significant benefit for those exemplary applications where, for example, a precise RC constant is desirable. Additionally, the use of the digitally controllable resistors as described herein will increase the device yield and result in significant cost saving as compared to methods like trimming.

BRIEF DESCRIPTION OF THE DRAWINGS

The accompanying drawings illustrate exemplary embodiments, wherein.

DETAILED DESCRIPTION

The following detailed description of the exemplary embodiments refers to the accompanying drawings. The same reference numbers in different drawings identify the same or similar elements. Also, the following detailed description does not limit the invention. Instead, the scope of the invention is defined by the appended claims.

According to exemplary embodiments, a highly linear and digitally controllable resistor structure having a good frequency response can be implemented in CMOS technology. The incremental resistance steps associated with the overall resistance of the digitally controllable resistor can be made arbitrarily small, irrespective of the on-resistance of the switch(es) which is effectively "absorbed".

The term "CMOS" can be used to refer to a particular style of digital circuitry design, and/or to the family of processes used to implement that circuitry on integrated circuits (i.e., chips). Exemplary commercial CMOS products are integrated circuits having millions or hundreds of millions of n-type and p-type transistors on a substrate between, for example, 0.1 and 4 $cm^2$ in size. In early CMOS fabrication processes, the gate electrode of these transistors was made of metal, e.g., aluminum. More recent CMOS processes switched from metal gate electrodes to polysilicon to better tolerate the high temperatures applied to the substrate after ion implantation. The CMOS substrate thus can include the metal (or polysilicon) layer disposed on top of an insulating oxide layer, which in turn is disposed on top of a semiconductor layer. There are several ways in which resistors can be implemented using CMOS technology. For example, polysilicon resistors can be constructed by depositing a layer of polysilicon on top of the CMOS substrate and adding contacts at both ends. Another way to fabricate resistors using CMOS technology is to implement them as N-well/P-well resistors. N-well/P-well resistors can be constructed by providing a layer of N- or P-doped semiconductor material over the substrate. The doping of the resistive material determines the resistivity (resistance per unit area) for a given process.

Figure 1:
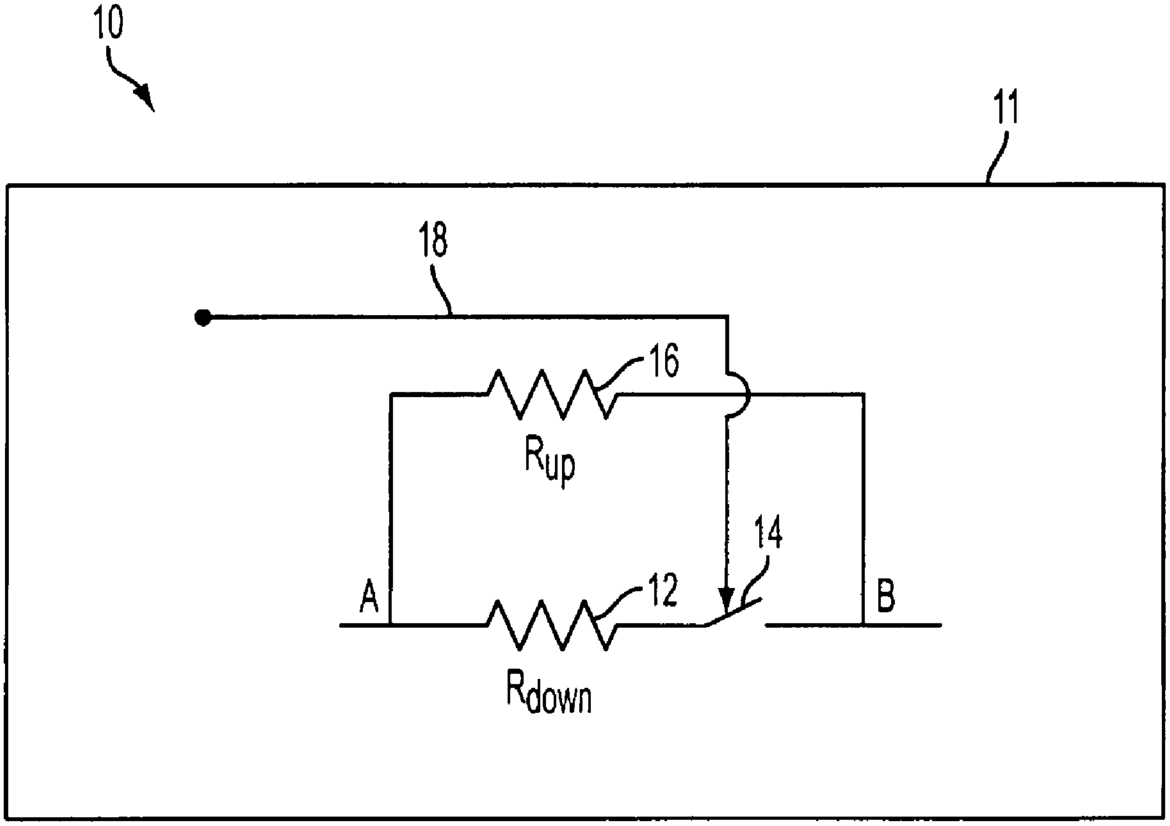
FIG. 1 illustrates a digitally controllable resistor according to an exemplary embodiment.

To fabricate a digitally controllable resistor according to these exemplary embodiments, a plurality of resistance stages or "building blocks" are provided on a CMOS substrate. An exemplary resistance stage 10 fabricated as integrated elements on a substrate 11, e.g., a CMOS elements on a CMOS substrate, is illustrated in FIG. 1. Therein, a first resistor 12 having a resistance value of $R_{down}$ is connected in series to a switch 14. The switch 14 has a resistance of $R_{switch}$ when it is closed. A second resistor 16, having a resistance value of $R_{up}$, is connected in parallel to the series combination of the first resistor 12 and the switch 14. A control line 18 is connected to the switch 14 for opening and closing the switch 14 in response to a control bit provided on the control line 18, e.g., a value of "0" closes the switch and a value of "1" opens the switch.

When the switch 14 is open, the switch resistance is high enough to be considered infinite for all practical purposes. In this case, the resistance between terminals A and B of the resistance stage 10 is $R_{up}$. However, when the switch 14 is closed, the effective resistance between terminals A and B of the resistance stage 10 is calculated by the following equation:

$$R_{AB} = \frac{R_{up}(R_{down} + R_{switch})}{R_{up} + R_{down} + R_{switch}} \tag{1}$$

With an appropriate selection of the resistance values $R_{up}$ and $R_{down}$ the difference between the two resistance values for stage 10 (i.e., the resistance value when the switch 14 is open and the resistance value when the switch 14 is closed) can be made equal to any desired step value (ΔR). This way, a resistance change of, for example, just a few ohms can be realized based on the position of the switch 14 irrespective of the value of its on-resistance $R_{switch}$.

Figure 2:
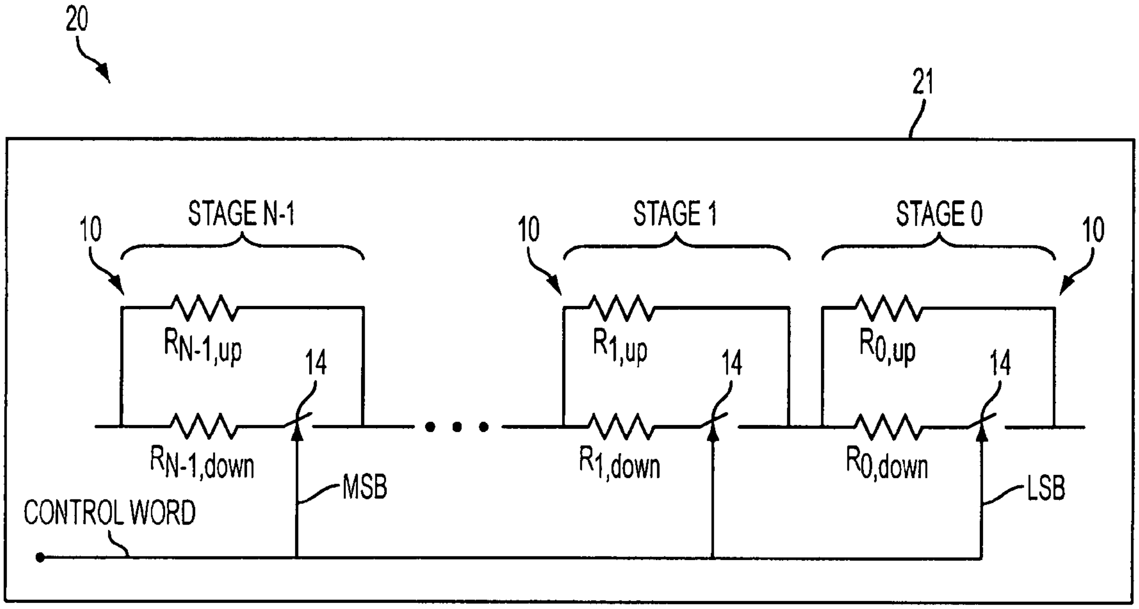
FIG. 2 illustrates a multi-stage digitally controllable resistor according to an exemplary embodiment.

In order to fabricate a digitally controllable resistor with a larger resistance variation range than that which is provided by a single resistance stage device, the total resistance to be provided by the device can instead be divided between a plurality of the stages 10 fabricated on a substrate and connected together in series. An exemplary multi-stage digitally controllable resistor device 20 disposed on a substrate 21, e.g., a CMOS substrate, according to these exemplary embodiments is shown in FIG. 2, where there are N stages 10 connected in series and N bits in the corresponding control word. Each of these stages 10 can thus be controlled by one bit of the digital control word, although only three stages are expressly illustrated in FIG. 2 to simplify the illustration. For example, the least significant bit (LSB) of the digital control word can control the switch 14 in stage 0 of the digitally controllable resistor 20 of FIG. 2, the second LSB of the control word can control the switch 14 in stage 1 and the most significant bit (MSB) can control the switch 14 in stage N−1.

The effective resistance of all N stages in the exemplary digitally controllable resistor 20 is equal when all of the switches 14 are closed, i.e., the total effective resistance is uniformly distributed among all stages 10. This switch condition also provides the minimum resistance $R_{min}$ for the digitally controllable resistor 20. When some or all of the switches 14 are open, the effective resistance for each stage 10 is binary weighted, by selecting the resistance values as described in the equations below, to make the total resistance of the digitally controllable resistor 20 change linearly with the value of the digital control word. The maximum resistance ($R_{max}$) is achieved when all the switches 14 are open. The intermediate resistance levels between $R_{min}$ and $R_{max}$ can be realized by varying the value of the digital control word between 0 and $2^N-1$.

To fabricate a multi-stage, digitally controllable resistor such as that shown in FIG. 2, a designer can, for example, select or be provided with values of N, $R_{min}$, ΔR, and $R_{switch}$. Using these four values, the specific resistance value of $R_{up}$ and $R_{down}$ for any stage 10 "n" (where n changes from 0 to N−1) can be calculated using the following formulas:

$$\begin{cases} R_{n,up} = \frac{R_{\min}}{N} + 2^n\Delta R \\ R_{n,up}\|(R_{n,down} + R_{switch}) = \frac{R_{\min}}{N} \end{cases} \Rightarrow \qquad (2)$$

$$\begin{cases} R_{n,up} = \frac{R_{\min}}{N} + 2^n\Delta R \\ R_{n,down} = \frac{R_{\min}}{N}\left(\frac{R_{\min}}{N\cdot 2^n\cdot\Delta R} + 1\right) - R_{switch} \end{cases}$$

$R_{max}$ is implicitly included in equations (2) by way of ΔR, $R_{min}$ and N. More specifically, the maximum resistance $R_{max}$ can be calculated as $R_{max}=R_{min}+N*\Delta R$. Thus alternatives to equations (2) can be used to fabricate multi-stage, digitally controllable resistors according to exemplary embodiments. For example, the designer can either explicitly define $R_{max}$ and then determine ΔR or can define ΔR and determine $R_{max}$.

These exemplary embodiments provide digitally controllable resistors having a number of beneficial qualities including, for example, linear voltage vs. current characteristics, good frequency response, low parasitic capacitance, linear resistance steps throughout the designed resistance range, and being completely monotonic over the whole range of the N-bit control word. To illustrate these characteristics an exemplary, digitally controllable resistor has been simulated using a 90 nm CMOS technology. This purely illustrative simulation was designed to have N=6 stages 10, an $R_{min}$ of 14 KΩ, a ΔR of 210 Ω and an $R_{switch}$ of 1.9 KΩ.

Figure 3:
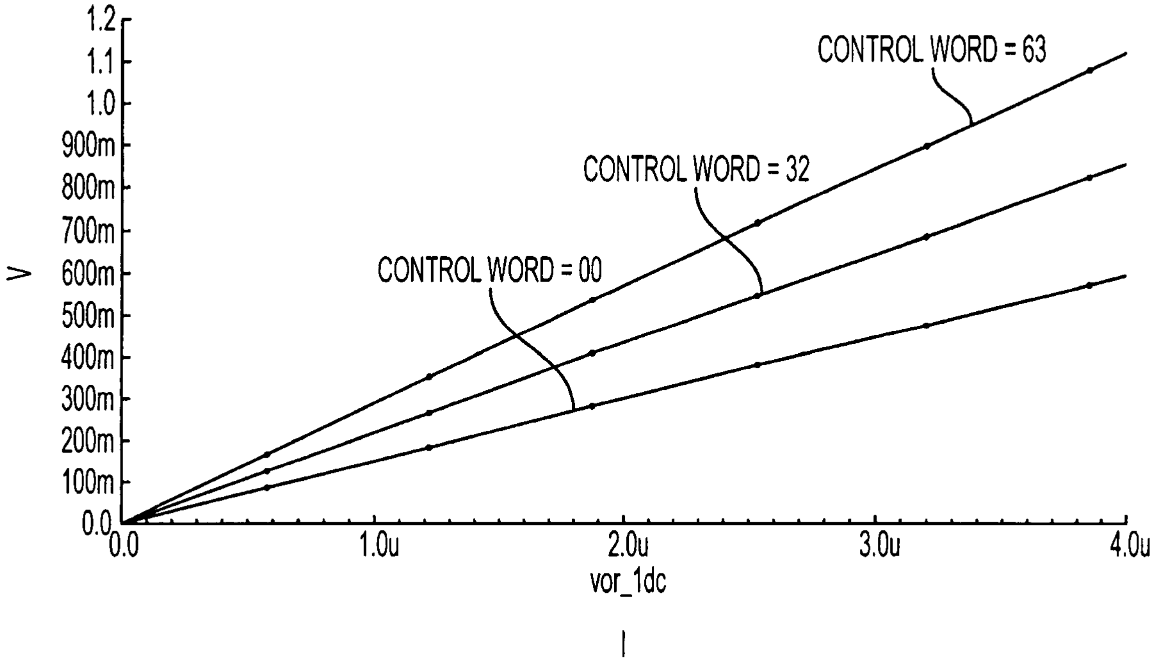
FIG. 3 is a graph illustrating exemplary V/I characteristics for a simulated digitally controllable resistor according to an exemplary embodiment.
Figure 4A:
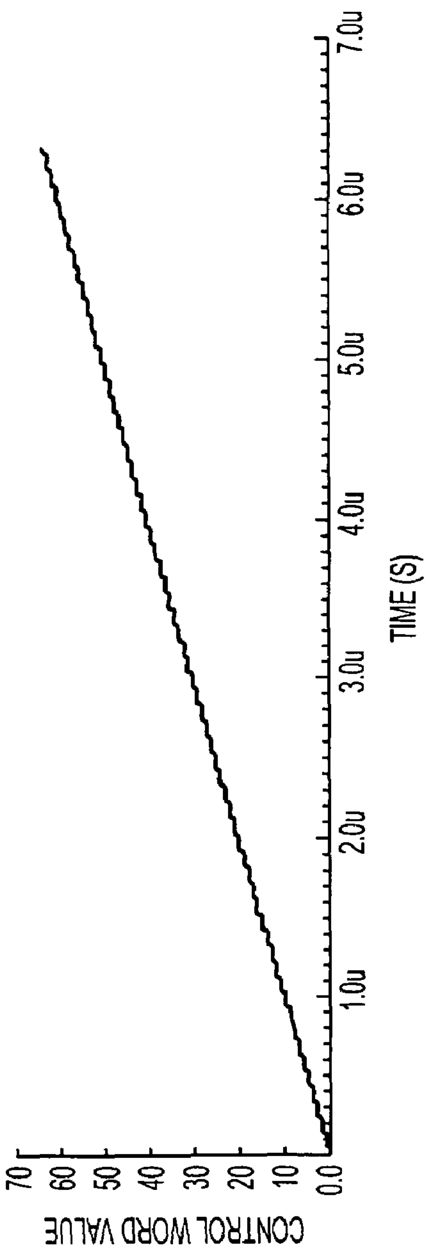
FIG. 4 is a graph illustrating output resistance as a function of control word input for a simulated digitally controllable resistor according to an exemplary embodiment.
Figure 4B:
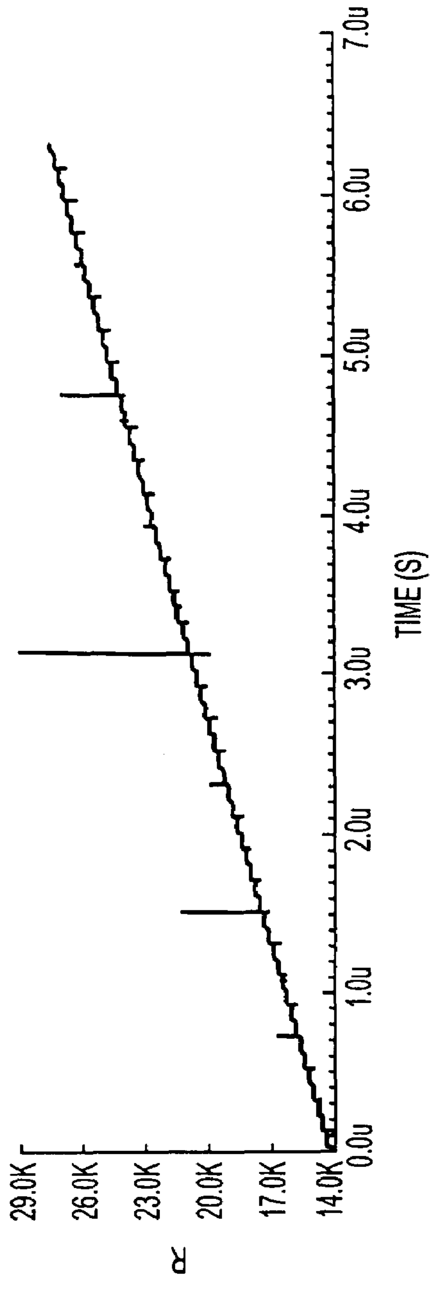
Figure 5:
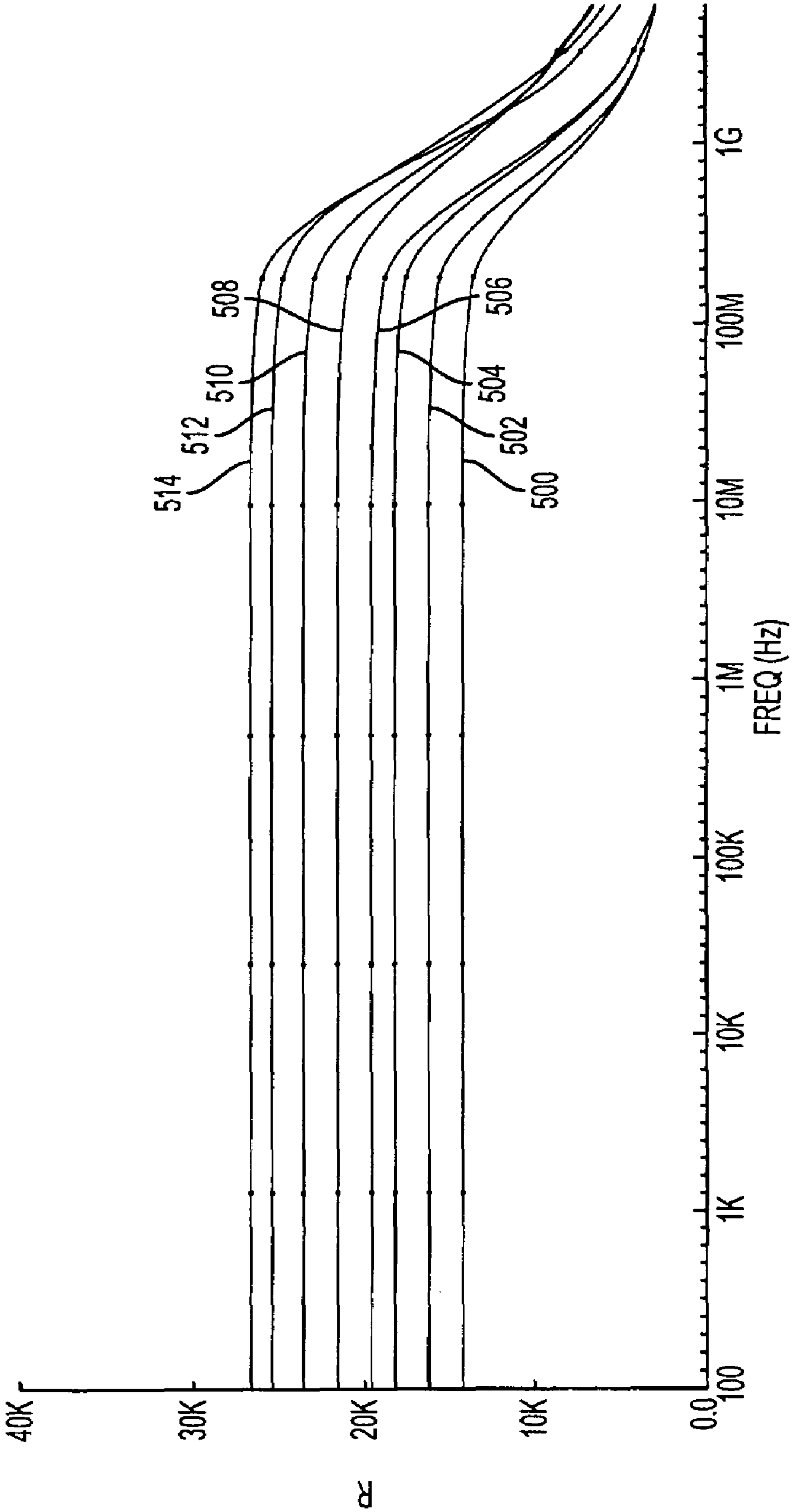
FIG. 5 is a graph illustrating frequency responses for a simulated digitally controllable resistor according to an exemplary embodiment.

FIGS. 3-5 are graphs illustrating results associated with this simulation. More specifically, FIG. 3 shows the voltage vs. current characteristics of the above-described simulated, digitally controllable resistor according to an exemplary embodiment using a 6-bit control word with values of 0, 32 and 63 when compared with equivalent ideal resistors. As shown in FIG. 3, the response of the simulated, digitally controllable resistor is almost identical to that of ideal, equivalent resistors.

Figure 6:
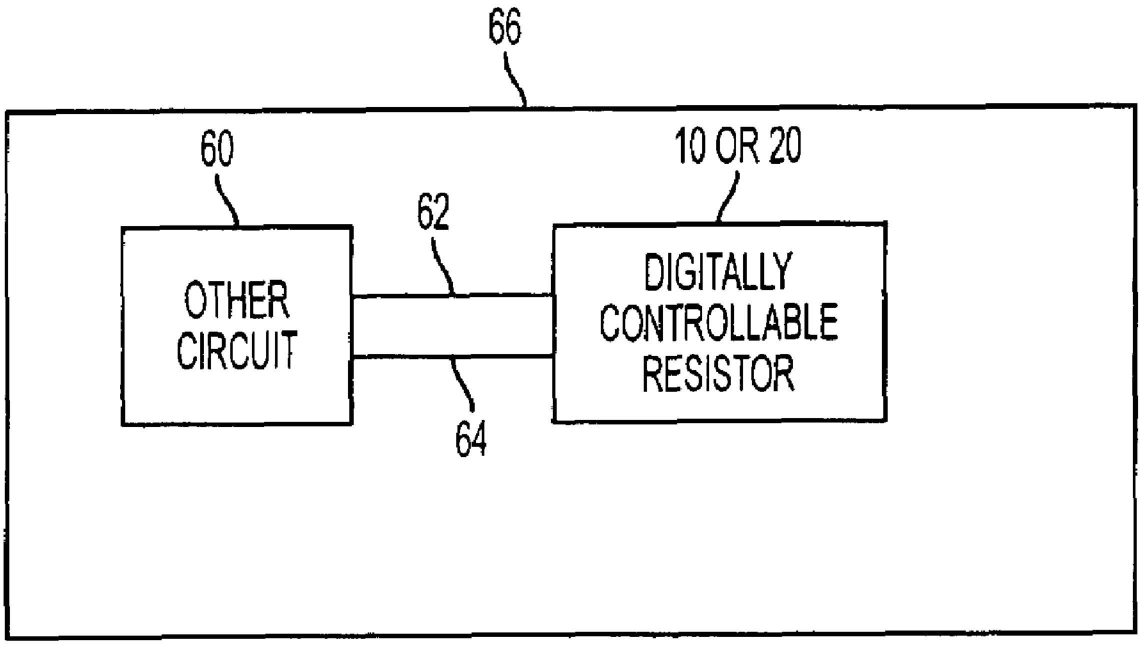
FIG. 6 depicts a digitally controllable resistor in combination with another circuit according to another exemplary embodiment.

FIGS. 4(*a*) and 4(*b*) illustrate the linearity of the resistance provided by the simulated, digitally controllable resistor described above. More specifically, FIG. 4(*a*) shows the change of the control word value from 0 to 63 and FIG. 4(*b*) shows the corresponding change in the output resistance of the overall (simulated) multi-stage structure. It can be seen in FIG. 4(*b*) that the resistance steps are very linear (e.g., approximately 210±5 Ω for each step) and strictly monotonic. The spikes seen in FIG. 4(*b*) are the result of momentary current flows which occur when the switches open or close. Since the switches do not open or close in zero time, the current changes momentarily when the control word changes. For example, the biggest spike occurs in the middle of FIG. 4(*b*) when all of the bits of the control word change. These artifacts will typically only occur during the calibration phase of the digitally controllable resistor (e.g., when the control word value is being determined by another circuit as shown and described below with respect to the exemplary embodiment of FIG. 6). Once normal operation starts, the control word will become static and there will be no such spikes in the resistance value of the resistor.

FIG. 5 shows the variation in the effective resistance of the simulated structure with respect to frequency for 6-bit control word values of 0, 9, 18, 27, 36, 45, 54 and 63, referring to plots 500, 502, 504, 506, 508, 510, 512, and 514, respectively. Therein, it can be seen that the resistance provided by the simulated, multi-stage structure according to this exemplary embodiment remains within about 1% of the programmed value up to a frequency of 100 MHz.

There are many different applications for digitally controllable resistors according to these exemplary embodiments. In addition to being used as a general purpose, digitally controllable, variable resistor, these devices can also be used in conjunction with other circuits. Thus, as shown generally in FIG. 6, a digitally controllable, variable resistor 10 or 20 according to the foregoing exemplary embodiments can be connected to another circuit 60 via a control line 62 and another connection 64. The control line 62 is used by the other circuit to set the resistance of the variable resistor 10 or 20 as described above, which resistance is experienced by the other circuit 60 via connection 64. For example, the other circuit 60, which is paired with the digitally controllable resistor 10 or 20, can estimate the effect of process spread on the chip 66 and can then generate a unique control word (communicated via line 62) to control the resistance of the variable resistance in order to minimize this effect.

Alternatively, the other circuit 60 can estimate the effect of temperature drift on the chip 66 and generate a unique control word (communicated via line 62) to control the resistance of unit 10 or 20 to minimize this effect. These, or other, types of tuning can be carried out in real time during operation of the chip 66. The other circuit 60 can be any type of other circuit which has a use for a controllable, variable resistor, e.g., a channel selection filter, examples of which can be found in, for example, the article entitled "*Tunable, Multi-bandwidth channel select filter for an LTE radio receiver*", Section 6.2, F. Oredsson, I. Din, Lund University, 2006, the disclosure of which is incorporated here by reference.

Figure 7:
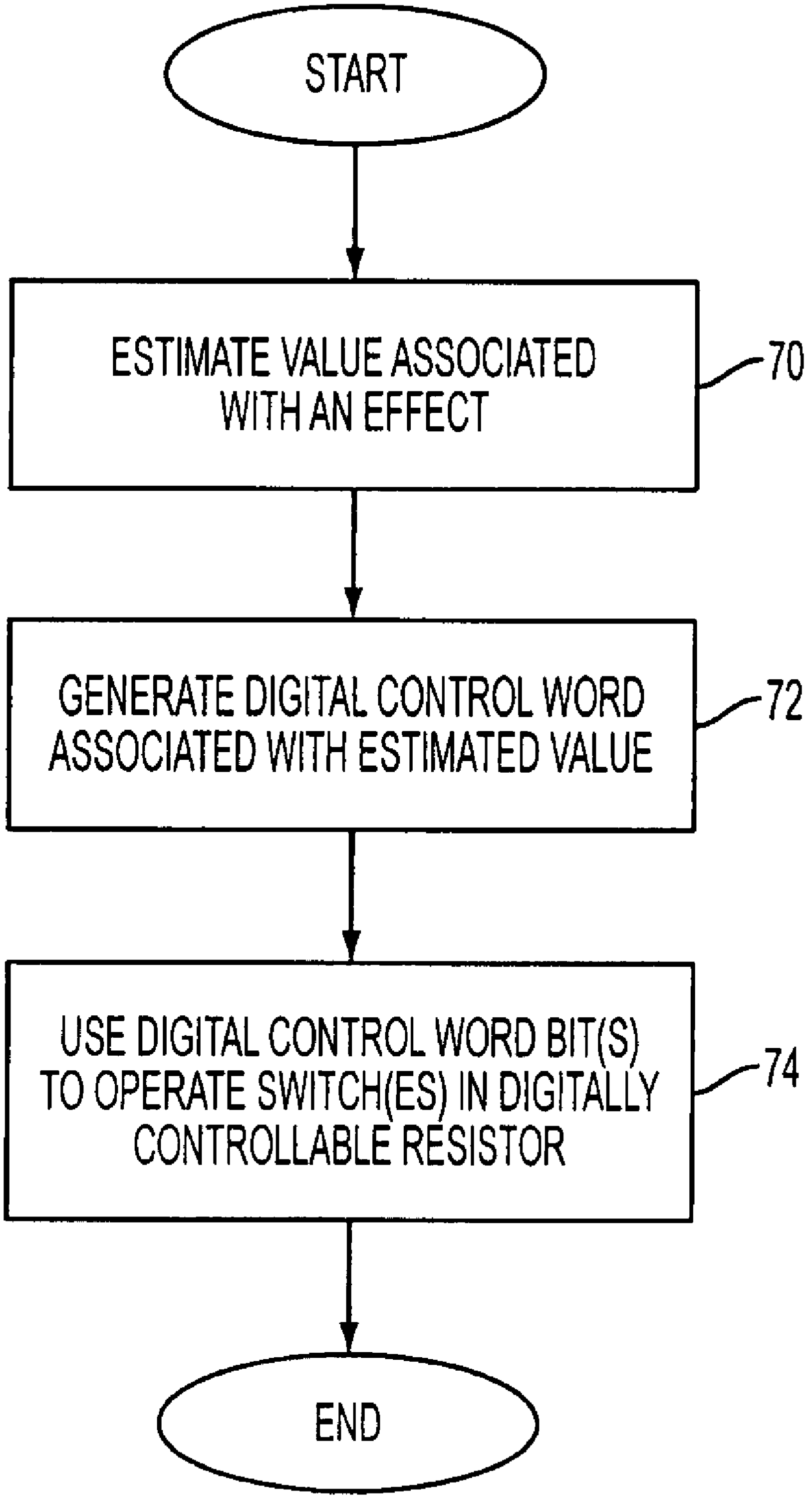
FIG. 7 is a flowchart illustrating a method for compensating for an effect on an integrated circuit chip according to an exemplary embodiment.

Thus, it will be appreciated that, according to an exemplary embodiment, a general method for tuning a circuit can include the steps of FIG. 7. Therein, at step 70, a value associated with an effect to be tuned for is estimated. A digital control word associated with the estimated value is generated at step 72 and bits in that digital control word are used to operate a respective at least one switch in a digitally controllable resistor at step 74.

It will be appreciated that the foregoing embodiments are purely exemplary and that variations to the foregoing can be implemented. For example, minimum sized switches, i.e., switches having a minimum channel width, can be used in these exemplary architectures to reduce the parasitic capacitance in the resistor. This can provide a significant benefit for those exemplary applications where, for example, a precise RC constant is desirable. Additionally, the use of the digitally controllable resistors as described herein will increase the device yield and result in significant cost saving as compared to methods like trimming.

The above-described exemplary embodiments are intended to be illustrative in all respects, rather than restrictive, of the present invention. Thus the present invention is capable of many variations in detailed implementation that can be derived from the description contained herein by a person skilled in the art. All such variations and modifications are considered to be within the scope and spirit of the present invention as defined by the following claims. No element, act, or instruction used in the description of the present application should be construed as critical or essential to the invention unless explicitly described as such. Also, as used herein, the article "a" is intended to include one or more items.

What is claimed is:

1. A digitally controllable resistor comprising:

a substrate;

at least one digitally controllable resistance stage formed on said substrate, each of said at least one stages including:

a first resistor connected in series with a switch;

a second resistor connected in parallel with said first resistor and said switch; and a control line connected to said switch for opening and closing said switch in response to a control bit associated therewith;

wherein said at least one digitally controllable resistance stage includes a plurality of digitally controllable resistance stages connected to one another in series and further wherein said control line provides a control word having a bit associated with each of said plurality of digitally controllable resistance stages;

wherein a total resistance of the digitally controllable resistor changes substantially linearly with a value of the control word;

wherein for each of said plurality of digitally controllable resistance stages n, a resistance value of said first resistor ($R_{n,down}$) is calculated as:

$$R_{n,down} = \frac{R_{\min}}{N}\left(\frac{R_{\min}}{N \cdot 2^n \cdot \Delta R} + 1\right) - R_{switch}$$

and a resistance value of said second resistor ($R_{n,up}$) is calculated as $$R_{n,up} = \frac{R_{\min}}{N} + 2^n \Delta R$$

where $R_{min}$ is a minimum total resistance of said digitally controllable resistor, ΔR is a step resistance of said digitally controllable resistor, N is a number of said plurality of digitally controllable resistance stages and $R_{switch}$ is an on resistance of said switch.

2. The digitally controllable resistor of claim 1, wherein said substrate is a complementary metal oxide semiconductor (CMOS) substrate having a gate layer, an insulator layer and a semiconductor layer.

3. The digitally controllable resistor of claim 1, wherein said total resistance has a maximum value when all of said switches are open and has a minimum value when all of said switches are closed.

4. The digitally controllable resistor of claim 1, wherein an effective resistance for each of said plurality of digitally controllable resistance stages n, is equal when said switch is closed and the effective resistance for each of said plurality of digitally controllable resistance stages n, is binary weighted when said switch is open.

5. An integrated circuit chip comprising:

a first circuit, disposed on said integrated circuit chip, for performing a function, said first circuit also capable of determining a compensating resistance value associated with performance of said function and generating a digital control word associated with said compensating resistance value; and a digitally controllable, variable resistor connected to said first circuit and including:

at least one digitally controllable resistance stage, each of said at least one stages including:

a first resistor connected in series with a switch;

a second resistor connected in parallel with said first resistor and said switch; and a control line connected to said first circuit and to said switch for opening and closing said switch in response to a respective bit of said digital control word;

wherein said at least one digitally controllable resistance stage includes a plurality of digitally controllable resistance stages connected to one another in series, wherein said first circuit is a filter and said function is channel selection;

wherein a total resistance of the digitally controllable resistor changes substantially linearly with a value of the control word;

wherein for each of said plurality of digitally controllable resistance stages n, a resistance value of said first resistor ($R_{n,down}$) is calculated as:

$$R_{n,down} = \frac{R_{\min}}{N}\left(\frac{R_{\min}}{N \cdot 2^n \cdot \Delta R} + 1\right) - R_{switch}$$

and a resistance value of said second resistor ($R_{n,up}$) is calculated as $$R_{n,up} = \frac{R_{\min}}{N} + 2^n \Delta R$$

where $R_{min}$ is a minimum total resistance of said digitally controllable resistor, ΔR is a step resistance of said digitally controllable resistor, N is a number of said plurality of digitally controllable resistance stages and $R_{switch}$ is an on resistance of said switch.

6. The integrated circuit chip of claim 5, further comprising a complementary metal oxide semiconductor (CMOS) substrate having a gate layer, an insulator layer and a semiconductor layer.

7. The integrated circuit chip of claim 5, wherein said total resistance has a maximum value when all of said switches are open and has a minimum value when all of said switches are closed.

8. The integrated circuit chip of claim 5, wherein said compensating resistance value is used to compensate for process spread on the integrated circuit chip.

9. The integrated circuit chip of claim 5, wherein said compensating resistance value is used to compensate for temperature drift on the integrated circuit chip.

10. The integrated circuit chip of claim 5, wherein an effective resistance for each of said plurality of digitally controllable resistance stages n, is equal when said switch is closed and the effective resistance for each of said plurality of digitally controllable resistance stages n, is binary weighted when said switch is open.

11. A method for compensating for an effect on an integrated circuit chip comprising:

estimating a value associated with said effect;

generating a digital control word associated with said value; and using at least one bit in said digital control word to operate a respective at least one switch in a digitally controllable, variable resistor, said variable resistor including:

at least one digitally controllable resistance stage, each of said at least one stages including:

a first resistor connected in series with one of said at least one switches; and a second resistor connected in parallel with said first resistor and said one of said at least one switches;

wherein said at least one digitally controllable resistance stage includes a plurality of digitally controllable resistance stages connected to one another in series;

wherein said effect is one of process spread and temperature drift;

wherein for each of said plurality of digitally controllable resistance stages n, a resistance value of said first resistor ($R_{n,down}$) is calculated as:

$$R_{n,down} = \frac{R_{\min}}{N}\left(\frac{R_{\min}}{N \cdot 2^n \cdot \Delta R} + 1\right) - R_{switch}$$

and a resistance value of said second resistor ($R_{n,up}$) is calculated as $$R_{n,up} = \frac{R_{\min}}{N} + 2^n \Delta R$$

where $R_{min}$ is a minimum total resistance of said digitally controllable resistor, ΔR is a step resistance of said digitally controllable resistor, N is a number of said plurality of digitally controllable resistance stages and $R_{switch}$ is an on resistance of said switch.

12. The method of claim 11, wherein a total resistance of the digitally controllable resistor changes substantially linearly with a value of the digital control word.

13. The method of claim 12, wherein an effective resistance for each of said plurality of digitally controllable resistance stages n, is equal when said switch is closed and the effective resistance for each of said plurality of digitally controllable resistance stages n, is binary weighted when said switch is open.

* * * * *

UNITED STATES PATENT AND TRADEMARK OFFICE

CERTIFICATE OF CORRECTION

PATENT NO. : 7,602,327 B2
APPLICATION NO. : 11/800954
DATED : October 13, 2009
INVENTOR(S) : Din et al.

It is certified that error appears in the above-identified patent and that said Letters Patent is hereby corrected as shown below:

On the Title Page, in Item (75), under “Inventors”, in Column 1, Line 2, delete “Lund” and insert -- Malmo --, therefor.

On Page 2, in Item (56), under “FOREIGN PATENT DOCUMENTS”, in Column 1, Line 2, delete “01 076507 A” and insert -- 01 078507 A --, therefor.

Signed and Sealed this

Fourth Day of May, 2010

David J. Kappos
*Director of the United States Patent and Trademark Office*